(12) United States Patent
Chang et al.

(10) Patent No.: US 10,957,728 B2
(45) Date of Patent: Mar. 23, 2021

(54) CMOS IMAGE SENSOR STRUCTURE WITH CROSSTALK IMPROVEMENT

(71) Applicant: TAIWAN SEMICONDUCTOR MANUFACTURING CO., LTD., Hsinchu (TW)

(72) Inventors: Hung-Chang Chang, Tainan (TW); Chun-Yuan Hsu, Kaohsiung (TW); Szu-Hung Yang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/206,763

(22) Filed: Nov. 30, 2018

(65) Prior Publication Data

US 2019/0127036 A1     May 2, 2019

Related U.S. Application Data

(62) Division of application No. 14/608,488, filed on Jan. 29, 2015, now Pat. No. 10,367,019.

(51) Int. Cl.
*H01L 27/146* (2006.01)

(52) U.S. Cl.
CPC .... *H01L 27/14621* (2013.01); *H01L 27/1464* (2013.01); *H01L 27/14685* (2013.01)

(58) Field of Classification Search
CPC ........... H01L 27/14621; H01L 27/1464; H01L 27/14685; H01L 27/146
See application file for complete search history.

(56) References Cited

U.S. PATENT DOCUMENTS

| | | | |
|---|---|---|---|
| 5,177,398 A | 1/1993 | Engemann | |
| 6,111,247 A * | 8/2000 | Sengupta | H01L 27/14618 250/208.1 |
| 6,222,180 B1 * | 4/2001 | Ormond | G01J 3/51 250/208.1 |
| 7,193,289 B2 * | 3/2007 | Adkisson | H01L 21/76819 257/292 |
| 7,502,058 B2 | 3/2009 | Hiatt et al. | |
| 7,960,225 B1 * | 6/2011 | Morita | H01L 27/1469 438/199 |
| 8,243,160 B2 | 8/2012 | Azuma et al. | |

(Continued)

FOREIGN PATENT DOCUMENTS

| | | |
|---|---|---|
| JP | 05-074928 A | 3/1993 |
| KR | 10-2013-0116005 A | 1/2013 |

(Continued)

OTHER PUBLICATIONS

Quirk and Serda "Seminconductor Manufacturing Technology" p. 227. Published by Prentice-Hall in 2001.

(Continued)

*Primary Examiner* — Tuan A Hoang
(74) *Attorney, Agent, or Firm* — Maschoff Brennan

(57) ABSTRACT

A semiconductor device includes a semiconductor substrate, a device layer over the semiconductor substrate, a first color filter in a top surface of the device layer and adjacent to an edge of the device layer, and a second color filter in the top surface of the device layer. The second color filter has substantially the same thickness and the same color as the first color filter.

20 Claims, 11 Drawing Sheets

(56) References Cited

U.S. PATENT DOCUMENTS

| | | |
|---|---|---|
| 9,209,339 B2 | 12/2015 | Chang et al. |
| 9,287,423 B2 * | 3/2016 | Mori ................. H01L 31/02325 |
| 9,299,740 B2 | 3/2016 | Tseng et al. |
| 2002/0027228 A1 * | 3/2002 | Lee ................... H01L 27/14692 |
| | | 257/69 |
| 2008/0090323 A1 | 4/2008 | Wu |
| 2009/0200622 A1 | 8/2009 | Tai et al. |
| 2010/0110271 A1 * | 5/2010 | Yanagita ........... H01L 27/14623 |
| | | 348/340 |
| 2011/0049664 A1 | 3/2011 | Kurita |
| 2012/0181552 A1 | 7/2012 | Nozaki |
| 2013/0307104 A1 | 11/2013 | Tsai et al. |
| 2015/0221695 A1 * | 8/2015 | Park .................. H01L 27/14636 |
| | | 257/774 |

FOREIGN PATENT DOCUMENTS

| | | |
|---|---|---|
| KR | 10-2013-0093450 A | 4/2014 |
| KR | 10-1459208 B1 | 11/2014 |

OTHER PUBLICATIONS

Thong et al., "TMAH etching of silicon and the interaction of etching parameters" in Sensors and Actuators A vol. 63, pp. 243-249. Published by Elsevier in 1997.

\* cited by examiner

CMOS IMAGE SENSOR STRUCTURE WITH CROSSTALK IMPROVEMENT

PRIORITY CLAIM AND CROSS-REFERENCE

This application is a Divisional application of the U.S. application Ser. No. 14/608,488, filed on Jan. 29, 2015, the entirety of which is incorporated by reference herein.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, while existing BSI CMOS image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
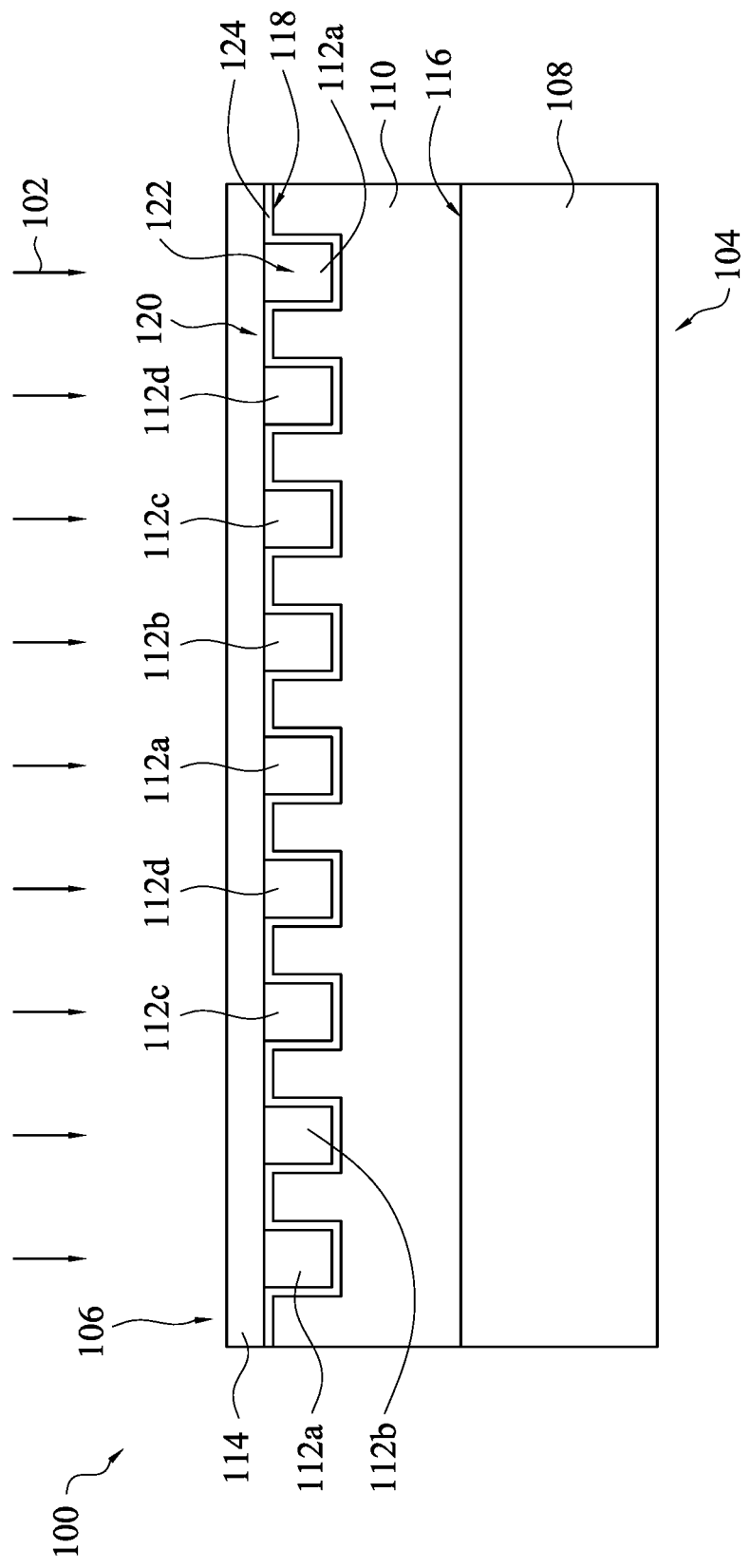
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical BSI CMOS image sensor, a metal grid or an oxide grid is disposed over a device layer to improve a crosstalk effect of the BSI CMOS image sensor. However, in the BSI CMOS image sensor including the metal grid, the metal grid covering the device layer blocks light projected from the backside of the BSI CMOS image sensor though the metal grid to the device layer, thus decreasing light absorption of the device layer. Accordingly, photoelectrons generated in the device layer are decreased, thereby reducing a quantum efficiency of the BSI CMOS image sensor. In the BSI CMOS image sensor including the oxide grid, the oxide grid is disposed over the device layer with several dielectric layers therebetween. After light projected from the backside of the BSI CMOS image sensor passes through the oxide grid, the light has to first pass through the dielectric layers and then to reach the device layer. The light is diffused to adjoining pixels due to the reflection and/or the refraction occurring between the oxide grid and the device layer, thus causing a crosstalk effect to be increased and worsening the image quality of the BSI CMOS image sensor.

Embodiments of the present disclosure are directed to providing a semiconductor device and a method for manufacturing the semiconductor device, in which various cavities are formed in a surface of a device layer to form a grid structure on the surface of the device layer, such that light projected from the backside of the semiconductor device to the device layer is not blocked by the grid structure, thereby increasing light absorption of the device layer. Furthermore, the grid structure is formed from a portion of the device layer, thereby preventing the light from being diffused from the grid structure to the device layer, thus greatly improving a crosstalk effect and increasing the image quality of the semiconductor device. Moreover, the grid structure is formed using a portion of the device layer, so as to generate photoelectrons in the grid structure for increasing brightness.

FIG. 1 is schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some examples, the semiconductor device 100 is a BSI CMOS image sensor device, which is operated to sense the incident light 102 projected from its back side 106.

As shown in FIG. 1, the semiconductor device 100 includes a substrate 108, a device layer 110, various color filters 112a-112d and a passivation layer 114. The substrate 108 is a semiconductor substrate, and may be composed of a single-crystalline semiconductor material or a compound semiconductor material. For example, the substrate 108 is a silicon substrate. In some examples, germanium or glass may also be used as a material of the substrate 108.

The device layer 110 is disposed over the substrate 108. In some examples, the device layer 110 is formed from silicon. For example, the device layer 110 is formed from epitaxial silicon. The device layer 110 has a first surface 116 and a second surface 118, which are located on two opposite sides of the device layer 110. The first surface 116 of the device layer 110 is adjacent to the substrate 108. The device layer 110 includes a grid structure 120 formed on the second surface 118 of the device layer 110. The grid structure 120 includes various cavities 122 formed in the device layer 110. In some examples, each cavity 122 has a cross-section in a shape of rectangle. The cavities 122 may be periodically arranged. A pitch between the cavities 122, a depth, a length and a width of each cavity 122 are modified according to requirements of the semiconductor device 100.

The color filters 112a, 112b, 112c and 112d are respectively disposed in the cavities 122 of the grid structure 120, in which the color filters 112a, 112b, 112c and 112d correspondingly fill the cavities 122. In some examples, as shown in FIG. 1, the semiconductor device 100 includes four kinds of color filters, i.e. the color filters 112a, 112b, 112c and 112d. The color filters 112a, 112b, 112c and 112d are arranged in sequence and repeatedly. In some exemplary examples, the color filters 112a, 112b, 112c and 112d includes red color filters, blue color filters, green color filters and white color filters. The white color filters may be formed from silicon oxide. In various examples, the semiconductor device 100 may include three kinds of color filters, such as red color filters, green color filters and blue color filters. In some examples, the semiconductor device 100 may include four kinds of color filters, such as red color filters, green color filters, blue color filters and yellow color filters.

Referring to FIG. 1 again, the passivation layer 114 is disposed on the second surface 118 of the device layer 110, and covers the grid structure 120 and the color filters 112a, 112b, 112c and 112d. The passivation layer 114 is suitable for use in protecting the grid structure 120, the color filters 112a, 112b, 112c and 112d, and the device layer 110 from being damaged. The passivation layer 114 may be formed from silicon oxide, silicon nitride or silicon oxynitride.

In some examples, as shown in FIG. 1, the semiconductor device 100 may optionally include a lining layer 124. The lining layer 124 covers the grid structure 120, and is disposed between the color filters 112a, 112b, 112c and 112d and the device layer 110 and between the passivation layer 114 and the device layer 110, i.e. the lining layer 124 is firstly formed to cover the grid structure 120 on the second surface 118 of the device layer 110, the color filters 112a, 112b, 112c and 112d are disposed in the cavities 122 of the grid structure 120 on the lining layer 124, and then the passivation layer 114 is formed to cover the lining layer 124 and the color filters 112a, 112b, 112c and 112d. For example, the lining layer 124 may be formed from silicon oxide.

By forming the grid structure 120 on the second surface 118 of the device layer 110, a crosstalk effect can be significantly improved since the grid structure 120 is a portion of the device layer 110 and there is no distance between the grid structure 120 and the device layer 110. In addition, the grid structure 120 is formed using a portion of the device layer 110, such that photoelectrons can be generated in the grid structure 120, thereby increasing brightness. Furthermore, the grid structure 120 is formed by using a portion of the device layer 110, and thus no additional film is needed for forming the grid structure 120, and the process cost is reduced. Moreover, the color filters 112a, 112b, 112c and 112d are disposed in the cavities 122 of the grid structure 122, such that thicknesses of the color filters 112a, 112b, 112c and 112d are substantially the same, thereby enabling light transmission through the color filters 112a, 112b, 112c and 112d to be uniform.

Figure 2A:
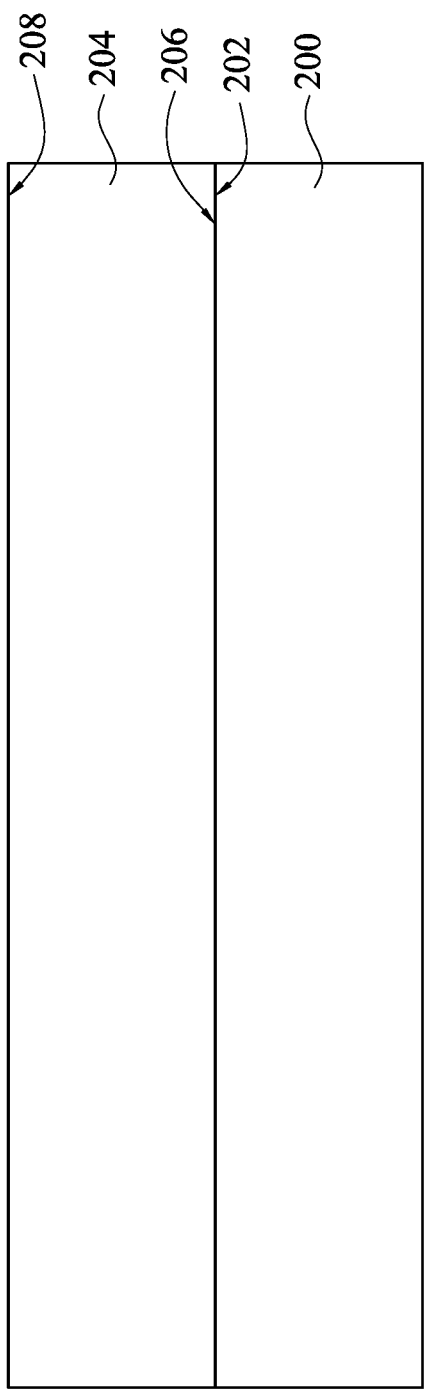
FIG. 2A through FIG. 2H are schematic cross-sectional views of intermediate stages showing a method for manufacturing a semiconductor device in accordance with various embodiments.

FIG. 2A through FIG. 2H are schematic cross-sectional views of intermediate stages showing a method for manufacturing a semiconductor device in accordance with various embodiments. As shown in FIG. 2A, a substrate 200 is provided. The substrate 200 is a semiconductor substrate, and may be composed of a single-crystalline semiconductor material or a compound semiconductor material. In some examples, silicon, germanium or glass may be used as a material of the substrate 200.

Referring to FIG. 2A again, a device layer 204 is formed on a surface 202 of the substrate 200 by using, for example, a deposition technique, an epitaxial technique or a bonding technique. In some examples, the operation of forming the device layer 204 includes forming the device layer 204 from silicon. In certain examples, the device layer 204 is formed from epitaxial silicon. The device layer 204 has a first surface 206 and a second surface 208 opposite to the first surface 206. The operation of forming the device layer 204 is performed to form the first surface 206 of the device layer 204 being adjacent to the surface 202 of the substrate 200.

Figure 2B:
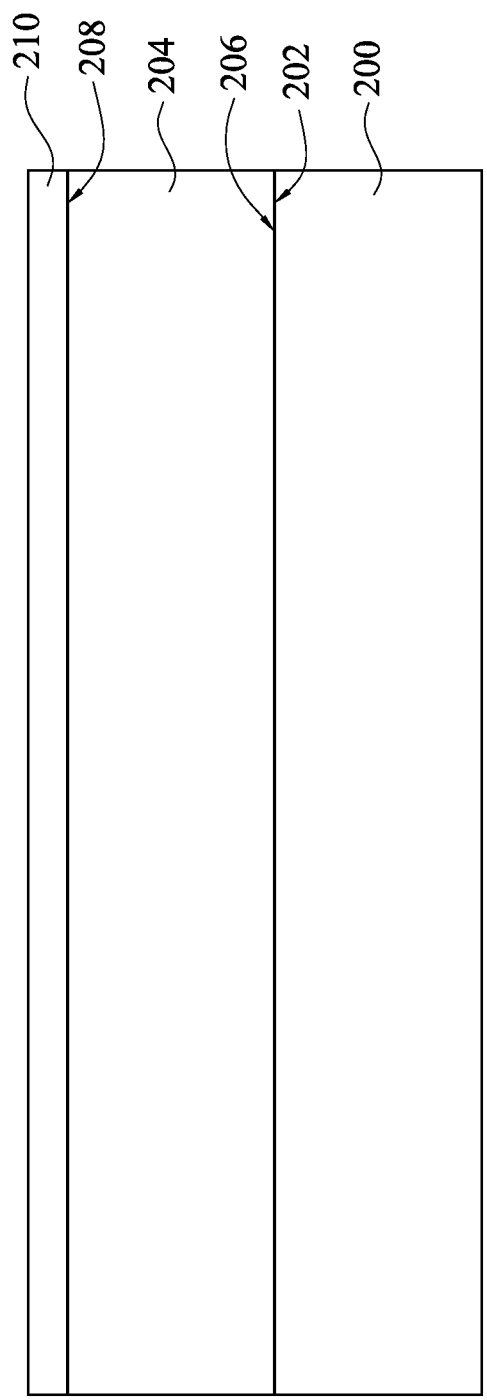
Figure 2C:
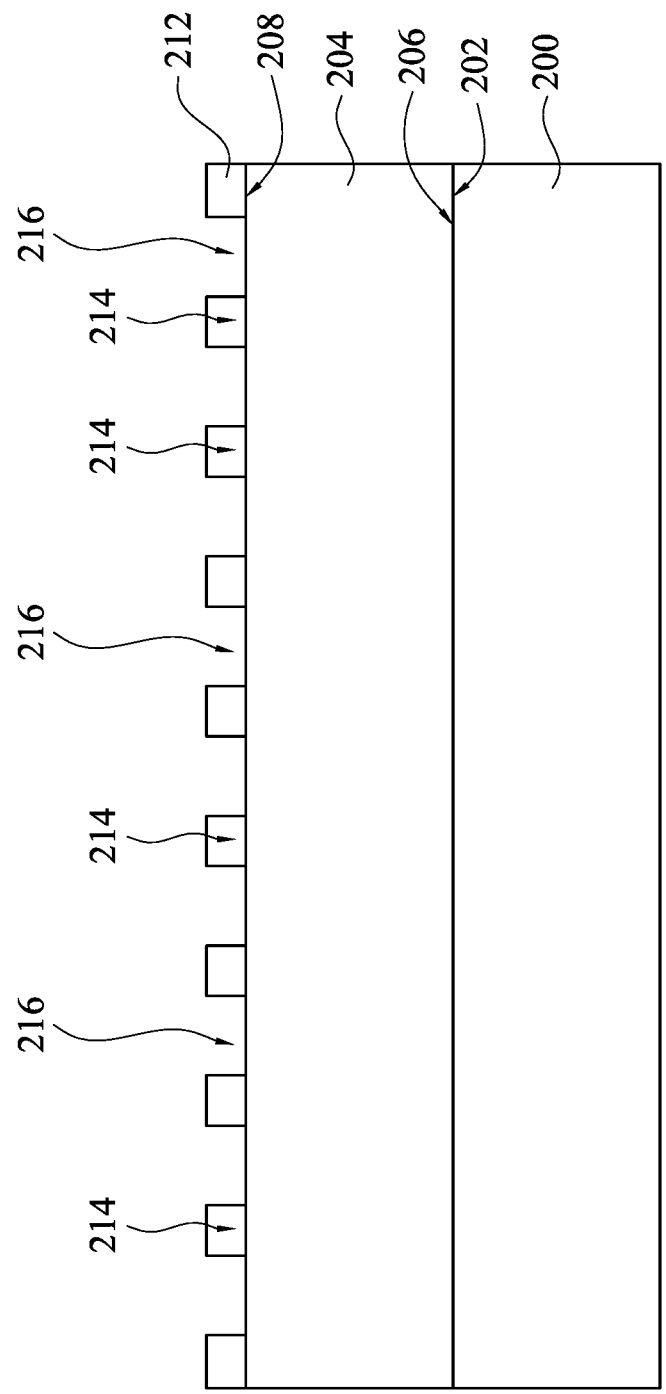
Figure 2D:
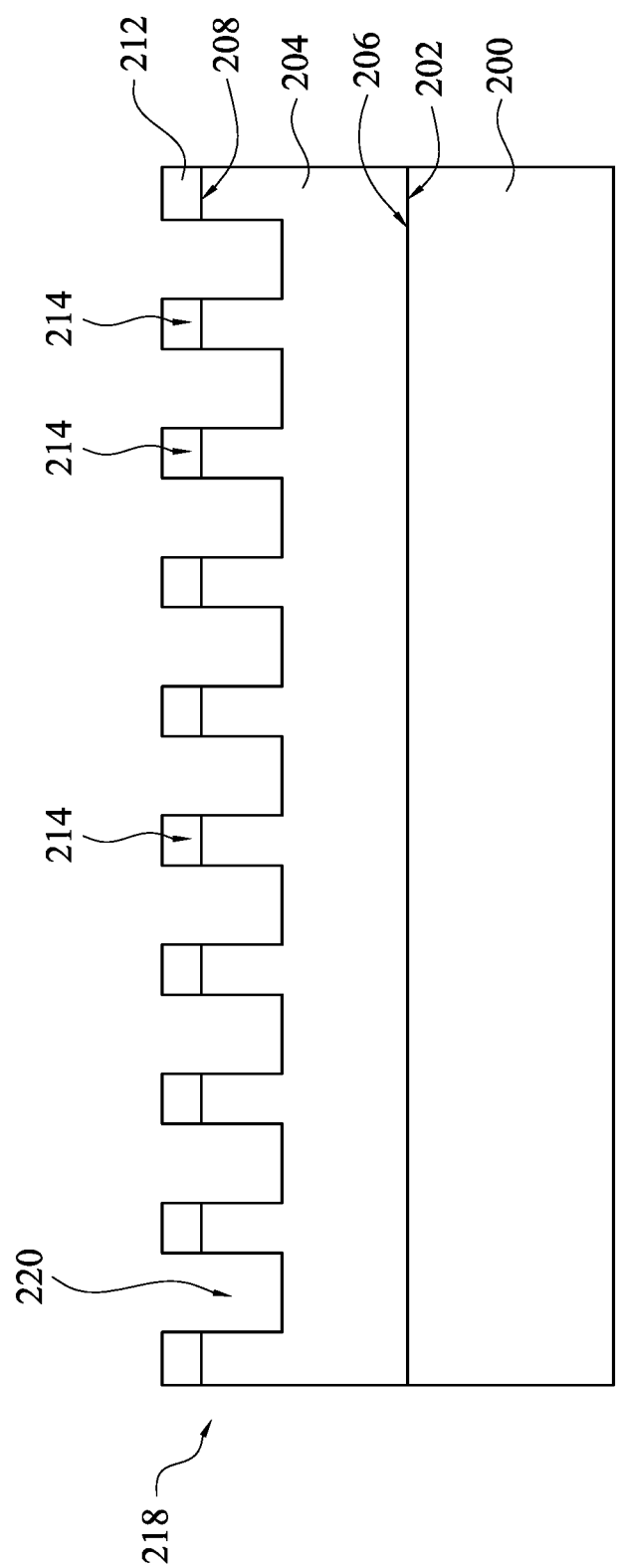
Figure 2E:
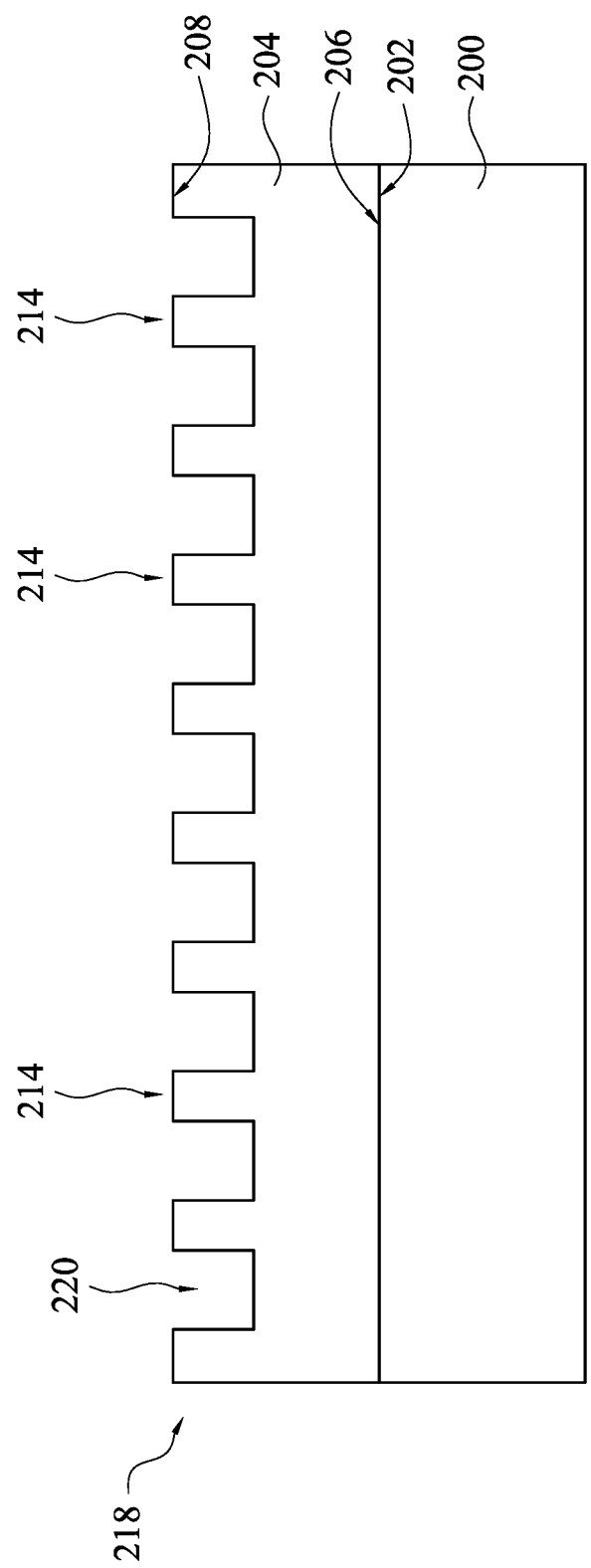

Referring to FIG. 2E firstly, a grid structure 218 is formed on the second surface 208 of the device layer 204. The operation of forming the grid structure 218 includes forming the grid structure 218 including various cavities 220. In some examples, as shown in FIG. 2C, the operation of forming the grid structure 218 includes forming a mask layer 212 to cover first portions 214 of the second surface 208 of the device layer 204 and to expose second portions 216 of the second surface 208 of the device layer 204, and removing portions of the device layer 204 from each of the second portions 216 of the second surface 208 of the device layer 204, so as to form the cavities 220 in the device layer 204. The operation of forming the mask layer 212 may include forming the mask layer 212 from silicon oxide.

In some exemplary examples, as shown in FIG. 2B and FIG. 2C, the operation of forming the mask layer 212 includes forming a mask material layer 210 to blanketly cover the second surface 208 of the device layer 204, and removing portions of the mask material layer 210 on the second portions 216 of the second surface 208 of the device layer 204. For example, the operation of forming the mask material layer 210 may be performed using a thermal oxidation process. In the thermal oxidation process, the second surface 208 of the device layer 204 is thermally oxidized to form the mask material layer 210. In addition, the operation of removing the portions of the mask material layer 210 may be performed using a photolithography technique and an etching technique. After the operation of removing the portions of the mask material layer 210 is completed, the remaining portions of the mask material layer 210 form the mask layer 212, which are located on the first portions 214 of the second surface 208 of the device layer 204, and the second portions 216 of the second surface 208 of the device layer 204 are exposed, as shown in FIG. 2C.

In some examples, the operation of removing the portions of the device layer 204 from the second portions 216 of the second surface 208 of the device layer 204 is performed using an etching technique with the mask layer 212 as an etching mask. For example, the operation of removing the portions of the device layer 204 from the second portions 216 of the second surface 208 of the device layer 204 is performed using an anisotropic etch technique. In some exemplary examples, the operation of removing the portions of the device layer 204 is performed using tetramethyl ammnium hydroxide (TMAH) as an etchant while the mask layer 212 is formed from silicon oxide and the device layer 204 is formed from silicon. The TMAH has high etching selectivity between the silicon oxide and silicon, so that the portions of the device layer 204 underlying the second portions 216 of the second surface 208 which are unmasked by the mask layer 212 are successfully removed while the first portions 214 of the second surface 208 of the device layer 204 are protected by the mask layer 212. As shown in FIG. 2D, after the operation of removing the portions of the device layer 204 is completed, the cavities 220 are formed in the device layer 204, and the grid structure 218 including the cavities 220 is formed on the second surface 208 of the device layer 204. For example, each of the cavities 220 may be formed to have a cross-section in a shape of rectangle. In addition, the cavities 220 are formed to be periodically arranged. A pitch between the cavities 220, a depth, a length and a width of each cavity 220 are modified according to product requirements.

As shown in FIG. 2E, in some examples, after the operation of forming the grid structure 218 is completed, the mask layer 212 is removed from the first portions 214 of the second surface 208 of the device layer 204 to expose the first portions 214 of the second surface 208, so as to complete the formation of the grid structure 218. In certain examples, the mask layer 212 is remained on the first portions 214 of the second surface 208 of the device layer 204 after the operation of forming the grid structure 218 is completed.

Figure 2F:
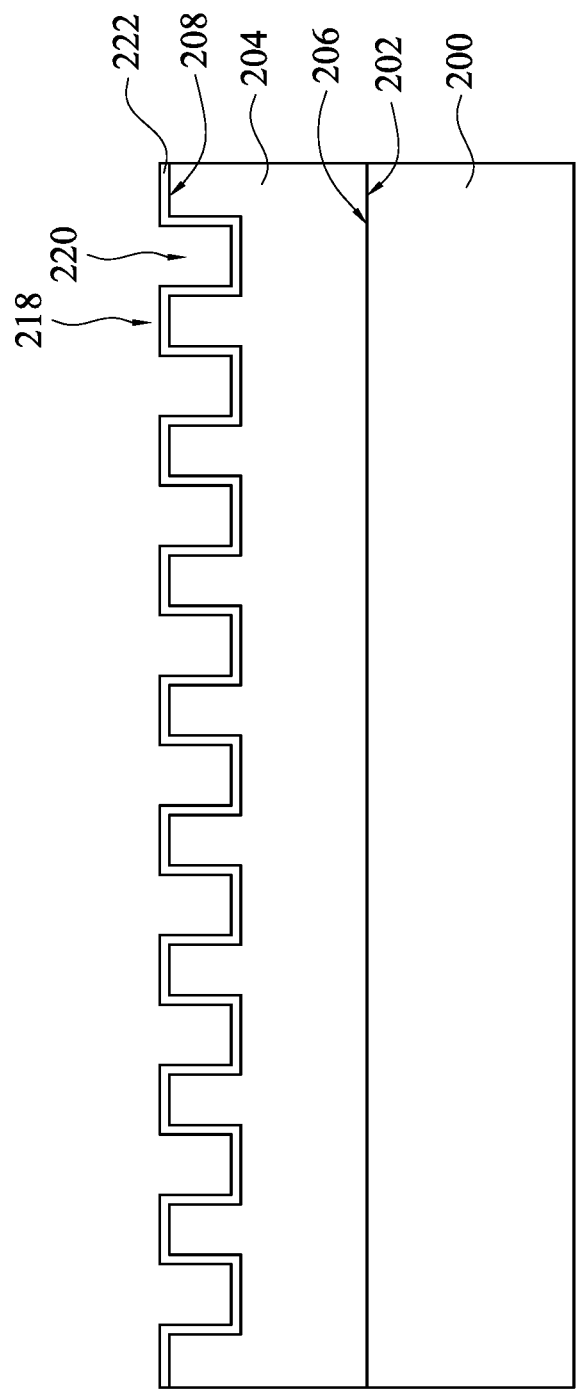

Referring to FIG. 2F, in some examples, after the grid structure 218 is formed on the second surface 208 of the device layer 204, a lining layer 222 may be optionally formed to cover the grid structure 218. For example, the lining layer 222 is conformal to the grid structure 218. In some exemplary examples, the operation of forming the lining layer 222 is performed using a thermal oxidation technique, in which the surface of the grid structure 218 of the device layer 204 is thermally oxidized to form the lining layer 222 covering the grid structure 218. Thus, the operation of forming the lining layer 222 is performed to form the lining layer 222 from silicon oxide while the device layer 204 is formed from silicon.

Figure 2G:
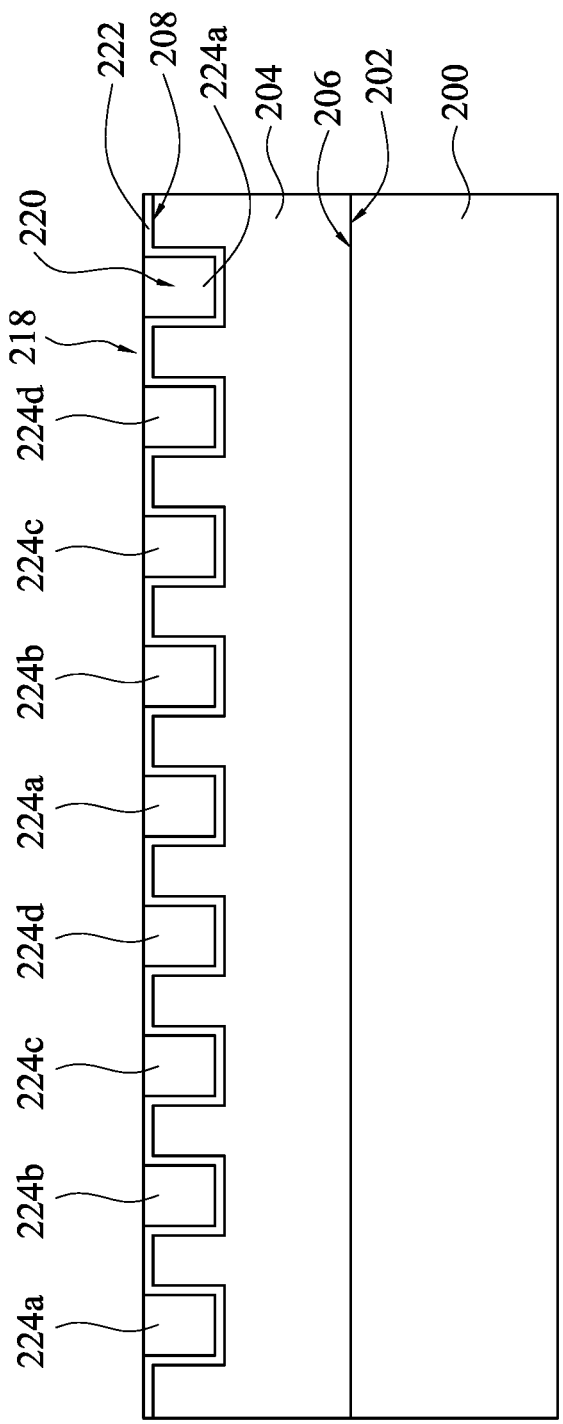

As shown in FIG. 2G, various color filters 224a, 224b, 224c and 224d are respectively formed in the cavities 220 of the grid structure 218. The color filters 224a, 224b, 224c and 224d are formed to correspondingly fill the cavities 220. In some examples, as shown in FIG. 2G, four kinds of color filters, i.e. the color filters 224a, 224b, 224c and 224d, are formed. The operation of forming the color filters 224a, 224b, 224c and 224d includes arranging the color filters 224a, 224b, 224c and 224d in sequence and repeatedly. In some exemplary examples, the operation of forming the color filters 224a, 224b, 224c and 224d is performed to form red color filters, blue color filters, green color filters and white color filters. The white color filters may be formed from a white color filter material or silicon oxide. In various examples, only three kinds of color filters, such as red color filters, green color filters and blue color filters, may be formed in the cavities 220. In certain examples, four kinds of color filters, such as red color filters, green color filters, blue color filters and yellow color filters, may be formed in the cavities 220.

Figure 2H:
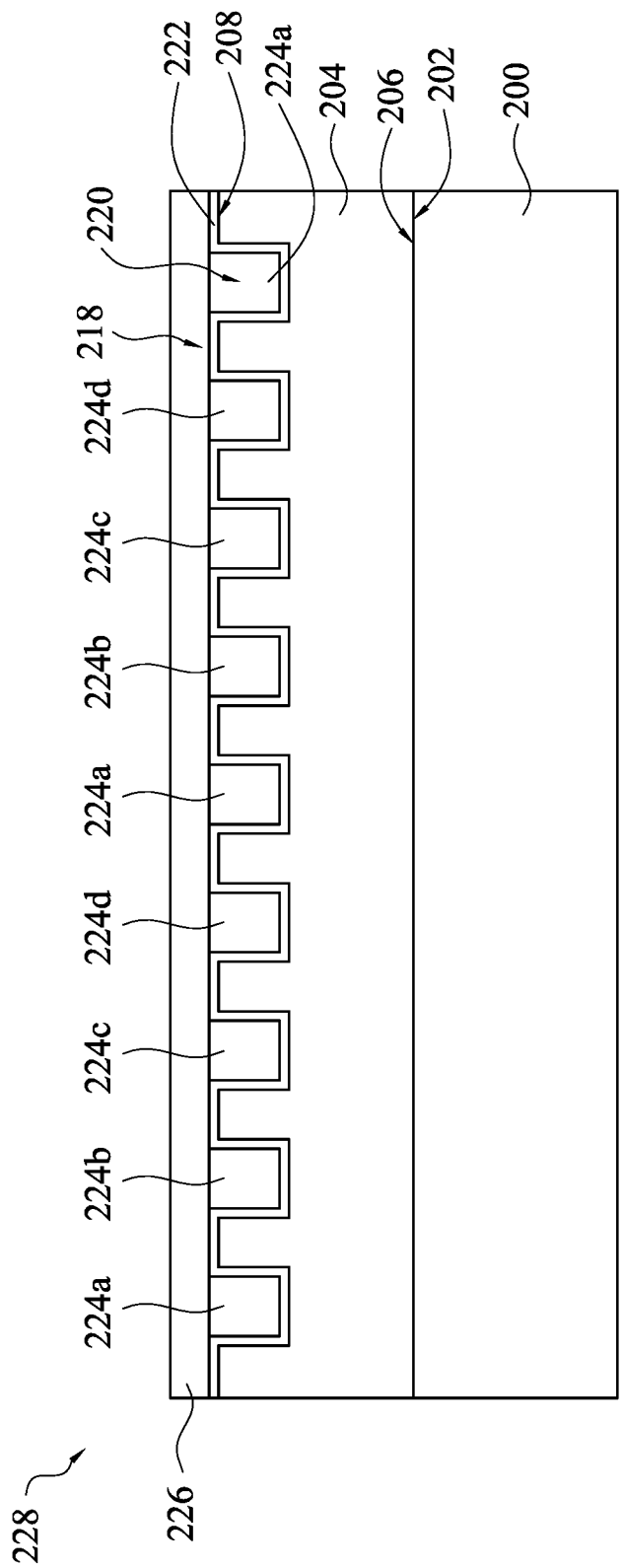

As shown in FIG. 2H, a passivation layer 226 is formed on the second surface 208 of the device layer 204, and covering the grid structure 218 and the color filters 224a, 224b, 224c and 224d to substantially complete a semiconductor layer 228. The passivation layer 226 is formed for protecting the grid structure 218, and the color filters 224a, 224b, 224c and 224d, and the device layer 204 from being damaged. In the examples without any lining layer covering the grid structure 218, the passivation layer 226 is formed to cover the second surface 208 of the device layer 204, the grid structure 218, and the color filters 224a, 224b, 224c and 224d. In the examples that the lining layer 222 covers the grid structure 218, the passivation layer 226 is formed to cover the lining layer 222 and the color filters 224a, 224b, 224c and 224d, in which the lining layer 222 is disposed between the color filters 224a, 224b, 224c and 224d and the device layer 204 and between the passivation layer 226 and the second surface 208 of the device layer 204. The operation of forming the passivation layer 226 may include forming the passivation layer 226 from silicon oxide, silicon nitride or silicon oxynitride. In some exemplary examples, the operation of forming the passivation layer 226 is performed using a plasma enhanced chemical vapor deposition (PECVD) technique.

With the grid structure 218 formed on the second surface 208 of the device layer 204 using a portion of the device layer 204, there is no distance between the grid structure 218 and the device layer 204, and photoelectrons are generated in the grid structure 218, such that a crosstalk effect can be significantly improved, thereby increasing brightness of light. Furthermore, no additional film is needed for forming the grid structure 218, so that the process cost is reduced. Moreover, the color filters 224a, 224b, 224c and 224d are disposed in the cavities 220 of the grid structure 218, so that thicknesses of the color filters 224a, 224b, 224c and 224d are substantially the same, thereby enabling light transmission through the color filters 224a, 224b, 224c and 224d to be uniform.

Figure 3:
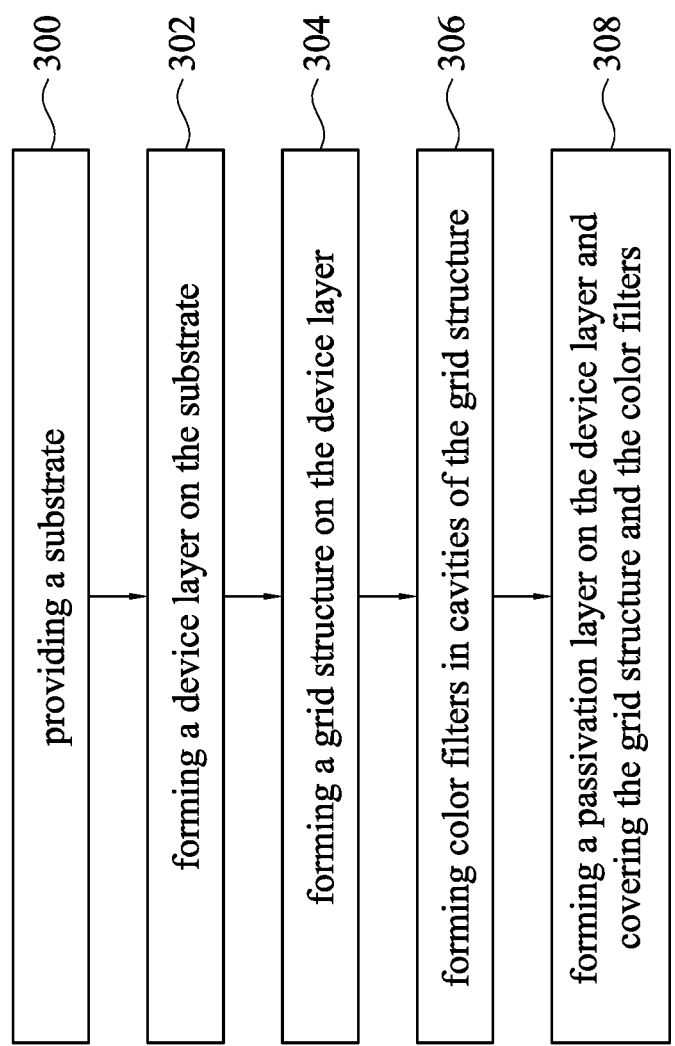
FIG. 3 is a flow chart of a method for manufacturing a semiconductor device in accordance with various embodiments.

Referring to FIG. 3 with FIG. 2A through FIG. 2H, FIG. 3 is a flow chart of a method for manufacturing a semiconductor device in accordance with various embodiments. The method begins at operation 300, where a substrate 200 is provided. At operation 302, a device layer 204 is formed on a surface 202 of the substrate 200, as shown in FIG. 2A. The operation of forming the device layer 204 is performed to form the device layer 204 on the surface 202 of the substrate 200 using, for example, a deposition technique, an epitaxial technique or a bonding technique. The device layer 204 has a first surface 206 and a second surface 208 opposite to the first surface 206.

At operation 304, as shown 2E, a grid structure 218 is formed on the second surface 208 of the device layer 204 using, for example, a patterning technique. The operation of forming the grid structure 218 includes forming the grid structure 218 including various cavities 220 in the device layer 204. In some examples, in the operation of forming the grid structure 218, a mask material layer 210 is firstly formed to blankety cover the second surface 208 of the device layer 204, i.e. the mask material layer 210 is formed to cover first portions 214 and second portions 216 of the second surface 208 of the device layer 204, as shown in FIG. 2B. The operation of forming the mask material layer 210 may be performed using a thermal oxidation process, in which the second surface 208 of the device layer 204 is thermally oxidized to form the mask material layer 210. For example, the device layer 204 is formed from silicon, and the mask material layer 210 is formed from silicon oxide. After the mask material layer 210 is formed, portions of the mask material layer 210 on the second portions 216 of the second surface 208 of the device layer 204 are removed, so as to form a mask layer 212 which is disposed on the first portions 214 of the second surface 208 and exposes the second portions 216 of the second surface 208, as shown in FIG. 2C. For example, the operation of removing the portions of the mask material layer 210 may be performed using a photolithography technique and an etching technique. Then, as shown in FIG. 2D, portions of the device layer 204 are removed from the second portions 216 of the second surface 208 of the device layer 204 to form the grid structure 218 including the cavities 220.

In some examples, the operation of removing the portions of the device layer 204 from the second portions 216 of the second surface 208 of the device layer 204 is performed using an etching technique with the mask layer 212 as an etching mask. For example, the operation of removing the portions of the device layer 204 is performed using an anisotropic etch technique. In some exemplary examples, the operation of removing the portions of the device layer 204 is performed using TMAH as an etchant while the mask layer 212 is formed from silicon oxide and the device layer 204 is formed from silicon. The TMAH has high etching selectivity between the silicon oxide and silicon, so that the portions of the device layer 204 underlying the second portions 216 of the second surface 208 which are unmasked by the mask layer 212 are successfully removed while the first portions 214 of the second surface 208 of the device layer 204 are protected by the mask layer 212.

As shown in FIG. 2E, in some examples, after the operation of forming the grid structure 218 is completed, the mask layer 212 is removed from the first portions 214 of the second surface 208 of the device layer 204 to expose the first portions 214 of the second surface 208. In certain examples, the mask layer 212 is remained on the first portions 214 of the second surface 208 of the device layer 204 after the operation of forming the grid structure 218 is completed.

In some examples, as shown in FIG. 2F, a lining layer 222 may be optionally formed to cover the grid structure 218. For example, the lining layer 222 is conformal to the grid structure 218. In some exemplary examples, the operation of forming the lining layer 222 is performed using a thermal oxidation technique, in which the surface of the grid structure 218 of the device layer 204 is thermally oxidized to form the lining layer 222 covering the grid structure 218. While the device layer 204 is formed from silicon, the operation of forming the lining layer 222 includes forming the lining layer 222 from silicon oxide.

At operation 306, as shown in FIG. 2G, various color filters 224a, 224b, 224c and 224d are respectively formed in the cavities 220 of the grid structure 218. The color filters 224a, 224b, 224c and 224d are formed to correspondingly fill the cavities 220. The color filters 224a, 224b, 224c and 224d are arranged in sequence and repeatedly. In some examples, as shown in FIG. 2G, four kinds of the color filters 224a, 224b, 224c and 224d are formed, in which the color filters 224a, 224b, 224c and 224d may include red color filters, blue color filters, green color filters and white color filters. The white color filters may be formed from a white color filter material or silicon oxide. In certain examples, four kinds of color filters, such as red color filters, green color filters, blue color filters and yellow color filters, may be formed in the cavities 220. In various examples, only three kinds of color filters, such as red color filters, green color filters and blue color filters, may be formed in the cavities 220.

At operation 308, as shown in FIG. 2H, a passivation layer 226 is formed on the second surface 208 of the device layer 204, and covering the grid structure 218 and the color filters 224a, 224b, 224c and 224d to substantially complete a semiconductor layer 228. In the examples without any lining layer covering the grid structure 218, the passivation layer 226 is formed to cover the second surface 208 of the device layer 204, the grid structure 218, and the color filters 224a, 224b, 224c and 224d. In the examples that the lining layer 222 is form to cover the grid structure 218, the passivation layer 226 is formed to cover the lining layer 222 and the color filters 224a, 224b, 224c and 224d. The passivation layer 226 may be formed from silicon oxide, silicon nitride or silicon oxynitride. In some exemplary examples, the operation of forming the passivation layer 226 is performed using a PECVD technique.

Figure 4:
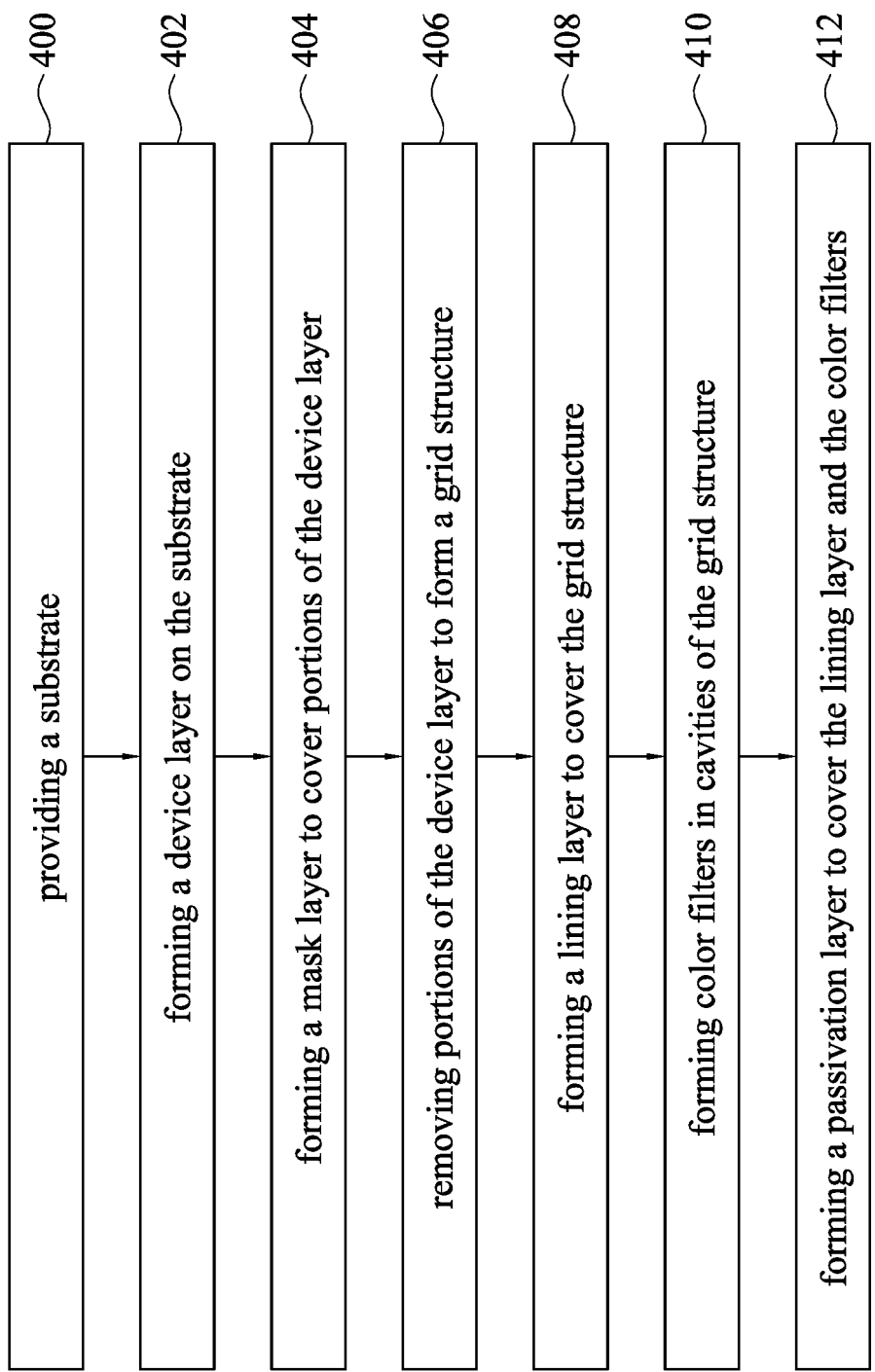
FIG. 4 is a flow chart of a method for manufacturing a semiconductor device in accordance with various embodiments.

Referring to FIG. 4 with FIG. 2A through FIG. 2H, FIG. 4 is a flow chart of a method for manufacturing a semiconductor device in accordance with various embodiments. The method begins at operation 400, where a substrate 200 is provided. At operation 402, as shown in FIG. 2A, a device layer 204 is formed on a surface 202 of the substrate 200. The device layer 204 is formed on the surface 202 of the substrate 200 using, for example, a deposition technique, an epitaxial technique or a bonding technique. The device layer 204 has a first surface 206 and a second surface 208 opposite to the first surface 206.

At operation 404, as shown in FIG. 2C, a mask layer 212 is formed on first portions 214 of the second surface 208 of the device layer 204 and exposing second portions 216 of the second surface 208. In some examples, in the operation of forming the mask layer 212, a mask material layer 210 is firstly formed to blankety cover the second surface 208 of the device layer 204, as shown in FIG. 2B. The operation of forming the mask material layer 210 may be performed using a thermal oxidation process. In some exemplary examples, the device layer 204 is formed from silicon, and the mask material layer 210 is formed from silicon oxide. Then, portions of the mask material layer 210 on the second portions 216 of the second surface 208 of the device layer 204 are removed, so as to complete the mask layer 212. The operation of removing the portions of the mask material layer 210 may be performed using a photolithography technique and an etching technique.

At operation 406, as shown in FIG. 2D, portions of the device layer 204 are removed from the second portions 216 of the second surface 208 of the device layer 204 to form the grid structure 218 including the cavities 220, in which the cavities 220 are formed in the device layer 204. In some examples, the operation of removing the portions of the device layer 204 from the second portions 216 of the second surface 208 of the device layer 204 is performed using an etching technique with the mask layer 212 as an etching mask. For example, the operation of removing the portions of the device layer 204 is performed using an anisotropic etch technique. In some exemplary examples, the operation of removing the portions of the device layer 204 is performed using TMAH as an etchant while the mask layer 212 is formed from silicon oxide and the device layer 204 is formed from silicon.

As shown in FIG. 2E, in some examples, after the grid structure 218 is formed, the mask layer 212 is removed from the first portions 214 of the second surface 208 of the device layer 204 to expose the first portions 214 of the second surface 208. In certain examples, the mask layer 212 is remained on the first portions 214 of the second surface 208 of the device layer 204 after the operation of forming the grid structure 218 is completed.

At operation 408, as shown in FIG. 2F, a lining layer 222 is formed to cover the grid structure 218. For example, the lining layer 222 is conformal to the grid structure 218. In some exemplary examples, the operation of forming the lining layer 222 is performed using a thermal oxidation technique. Thus, while the device layer 204 is formed from silicon, the operation of forming the lining layer 222 includes forming the lining layer 222 from silicon oxide.

At operation 410, as shown in FIG. 2G, various color filters 224a, 224b, 224c and 224d are respectively formed in the cavities 220 of the grid structure 218 on the lining layer 222. The color filters 224a, 224b, 224c and 224d are formed to correspondingly fill the cavities 220. The color filters 224a, 224b, 224c and 224d are arranged in sequence and repeatedly. In some examples, four kinds of the color filters 224a, 224b, 224c and 224d are formed, in which the color filters 224a, 224b, 224c and 224d may include red color filters, blue color filters, green color filters and white color filters. In certain examples, four kinds of color filters, such as red color filters, green color filters, blue color filters and yellow color filters, may be formed in the cavities 220. In various examples, only three kinds of color filters, such as red color filters, green color filters and blue color filters, may be formed in the cavities 220.

At operation 412, as shown in FIG. 2H, a passivation layer 226 is formed to cover the lining layer 222 and the color filters 224a, 224b, 224c and 224d to substantially complete a semiconductor layer 228. The passivation layer 226 may be formed from silicon oxide, silicon nitride or silicon oxynitride. In some exemplary examples, the operation of forming the passivation layer 226 is performed using a PECVD technique.

In accordance with an embodiment of the present disclosure, a semiconductor device includes a semiconductor substrate, a device layer over the semiconductor substrate, a first color filter in a top surface of the device layer and adjacent to an edge of the device layer, and a second color filter in the top surface of the device layer. The second color filter has substantially the same thickness and the same color as the first color filter.

In accordance with another embodiment of the present disclosure, a semiconductor device includes a semiconductor substrate, a device layer over the semiconductor substrate, a first color filter in a top surface of the device layer, a lining layer having a first portion wrapping around the first color filter and a second portion over the top surface of the device layer, and a passivation layer over the first color filter and the second portion of the lining layer and having a substantially flat bottom surface.

In accordance with yet another embodiment of the present disclosure, a semiconductor device includes a semiconductor substrate, a device layer over the semiconductor substrate, and a plurality of color filters in a top surface of the device layer, wherein the entire color filters of the semiconductor device that have the same color have substantially the same thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illuminated image sensor, comprising:
   a semiconductor substrate;
   a device layer over the semiconductor substrate;
   a semiconductive grid extending upwards from the device layer, wherein the device layer and the semiconductive grid are defined by a single piece of semiconductive material that is continuous throughout;
   a first color filter in a top surface of the device layer and adjacent to an edge of the device layer; and
   a second color filter in the top surface of the device layer, having substantially the same thickness and the same color as the first color filter, wherein the semiconductive grid is at least partially between the first color filter and the second color filter.

2. The back side illuminated image sensor of claim 1, further comprising:
   a third color filter in the top surface of the device layer, adjacent to the first color filter, and having substantially the same thickness as the first color filter.

3. The back side illuminated image sensor of claim 1, further comprising:
   a lining layer over the top surface of the device layer, wherein a top surface of the first color filter is substantially coplanar with a top surface of the lining layer.

4. The back side illuminated image sensor of claim 3, further comprising:
   a passivation layer over and in contact with the first color filter and the lining layer.

5. The back side illuminated image sensor of claim 1, further comprising:
   a passivation layer over the first color filter and the second color filter and having a substantially flat bottom surface.

6. The back side illuminated image sensor of claim 1, wherein the semiconductive grid of the device layer is configured to generate photoelectrons therein.

7. A back side illuminated image sensor, comprising:
   a semiconductor substrate;
   a semiconductive device layer over the semiconductor substrate;
   a semiconductive grid extending upwards from the semiconductive device layer, wherein the semiconductive device layer and the semiconductive grid are defined by a single piece of semiconductive material that is continuous throughout;
   a first color filter over a top surface of the semiconductive device layer and adjacent the semiconductive grid;
   a lining layer having a first portion wrapping around the first color filter and a second portion over the top surface of the semiconductive device layer, wherein the top surface of the semiconductive device layer is higher than a bottom surface of the first color filter; and a passivation layer over the first color filter and the second portion of the lining layer and having a substantially flat bottom surface.

8. The back side illuminated image sensor of claim 7, wherein the passivation layer is in contact with the second portion of the lining layer.

9. The back side illuminated image sensor of claim 7, wherein the passivation layer is in contact with the first color filter.

10. The back side illuminated image sensor of claim 7, wherein a top surface of the first color filter is substantially coplanar with a top surface of the second portion of the lining layer.

11. The back side illuminated image sensor of claim 10, further comprising:
   a second color filter over the top surface of the semiconductive device layer and having a bottom surface substantially coplanar with the bottom surface of the first color filter.

12. The back side illuminated image sensor of claim 7, further comprising:
   a second color filter in the top surface of the semiconductive device layer, adjacent to an edge of the semiconductive device layer, and having the same color as the first color filter, wherein a bottom surface of the first color filter is substantially coplanar with a bottom surface of the second color filter.

13. The back side illuminated image sensor of claim 12, wherein a top surface of the first color filter is substantially coplanar with a top surface of the second color filter.

14. The back side illuminated image sensor of claim 7, wherein the passivation layer has a substantially flat top surface.

15. A back side illuminated image sensor, comprising:
   a semiconductor substrate;
   a device layer over the semiconductor substrate;
   a plurality of color filters in a top surface of the device layer, wherein the entire color filters of the semiconductor device that have the same color have substantially the same thickness; and
   a grid over the device layer and surrounding each of the color filters, wherein the grid is configured to generate photoelectrons therein, wherein the device layer and the grid are a monolithic structure.

16. The back side illuminated image sensor of claim 15, wherein the entire color filters of the semiconductor device have substantially the same thickness.

17. The back side illuminated image sensor of claim 15, wherein the device layer comprises a semiconductor material.

18. The back side illuminated image sensor of claim 15, further comprising:
   a lining layer having first portions over the top surface of the device layer and second portions between the color filters and the device layer, wherein top surfaces of the color filters are coplanar with top surfaces of the first portions of the lining layer.

19. The back side illuminated image sensor of claim 18, further comprising:
   a passivation layer over and in contact with the top surfaces of the first portions of the lining layer and having a substantially flat bottom surface.

20. The back side illuminated image sensor of claim 19, wherein the passivation layer has a substantially flat top surface.

* * * * *